United States Patent [19]

Imai

[11] Patent Number: 5,084,595

[45] Date of Patent: Jan. 28, 1992

[54] CERAMIC BASE FOR A SEMICONDUCTOR DEVICE

[75] Inventor: Kunihiko Imai, Nagano, Japan

[73] Assignee: Shinko Electric Industries Co., Ltd., Nagano, Japan

[21] Appl. No.: 598,360

[22] Filed: Oct. 15, 1990

[30] Foreign Application Priority Data

Oct. 18, 1989 [JP] Japan .................. 1-271396

[51] Int. Cl.$^5$ ............................................ H05K 5/00
[52] U.S. Cl. .................................... 174/50; 174/52.1; 174/52.4
[58] Field of Search .................. 174/52.4, 52.3, 52.2, 174/50; 357/74, 80

[56] References Cited

U.S. PATENT DOCUMENTS

| | | | |
|---|---|---|---|
| 4,007,479 | 2/1977 | Kowalski | 357/70 |
| 4,288,841 | 9/1981 | Gogal | 361/414 |
| 4,330,683 | 5/1982 | Parker | 174/52.4 |
| 4,474,017 | 5/1988 | Koors et al. | 361/395 |

Primary Examiner—Leo P. Picard
Assistant Examiner—Bot Lee Ledynh
Attorney, Agent, or Firm—Michael N. Meller

[57] ABSTRACT

A ceramic base used for a semiconductor device is plate-shaped and is made of a material consisting essentially of ceramic. In plan view, the base is rectangular and has four corner portions each located between two adjacent side walls. The corner portion comprises a main bevel and two auxiliary bevels located at respective sides of the main bevel and extending to the two side walls, respectively, so that two first corners are defined between the main bevel and the auxiliary bevels, respectively, and two second corners are defined between the auxiliary bevels and the side walls of the base, respectively.

9 Claims, 8 Drawing Sheets (EMBODIMENT)  (COMPARATIVE EXAMPLE)  (PRIOR ART)

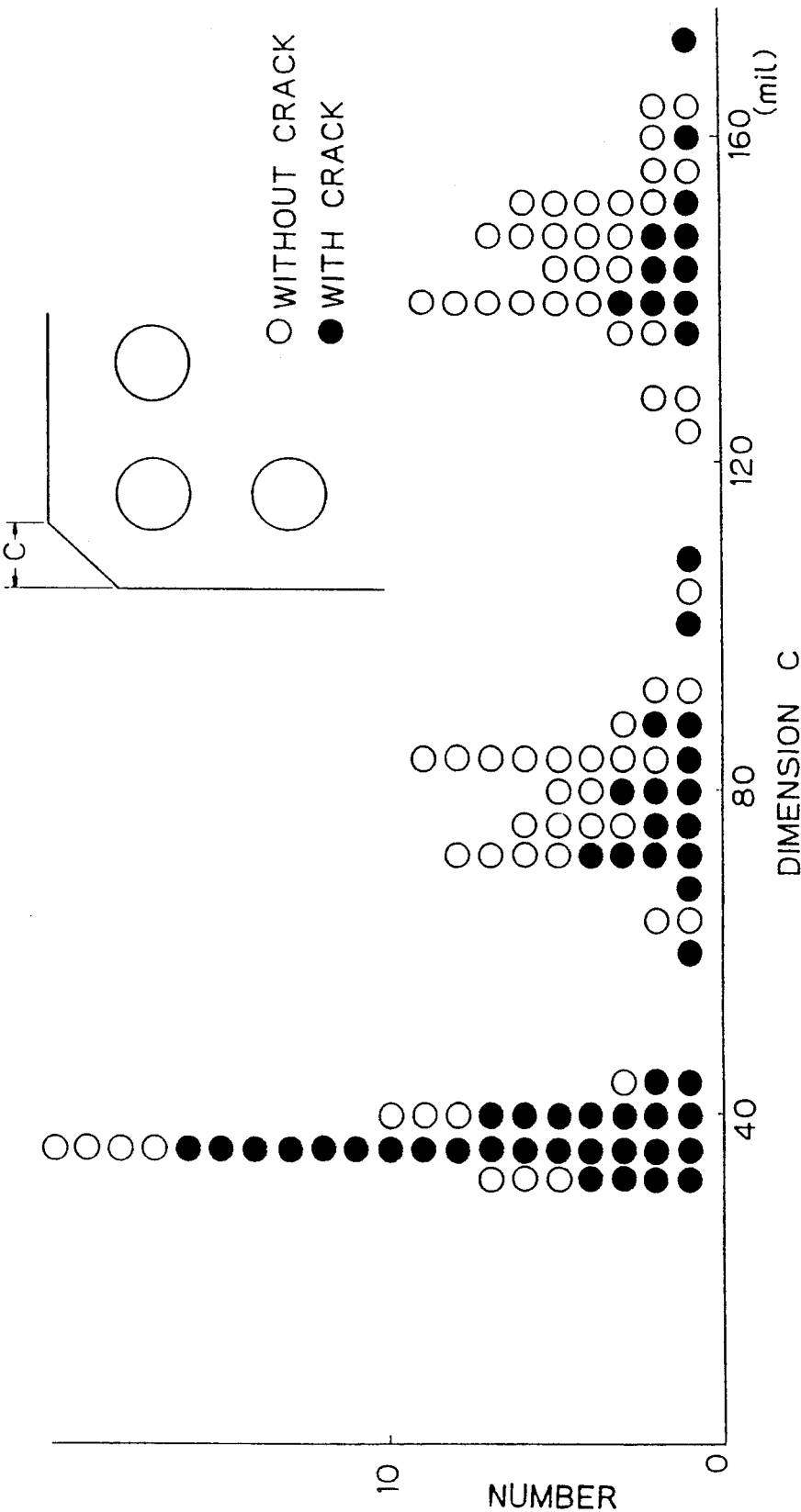

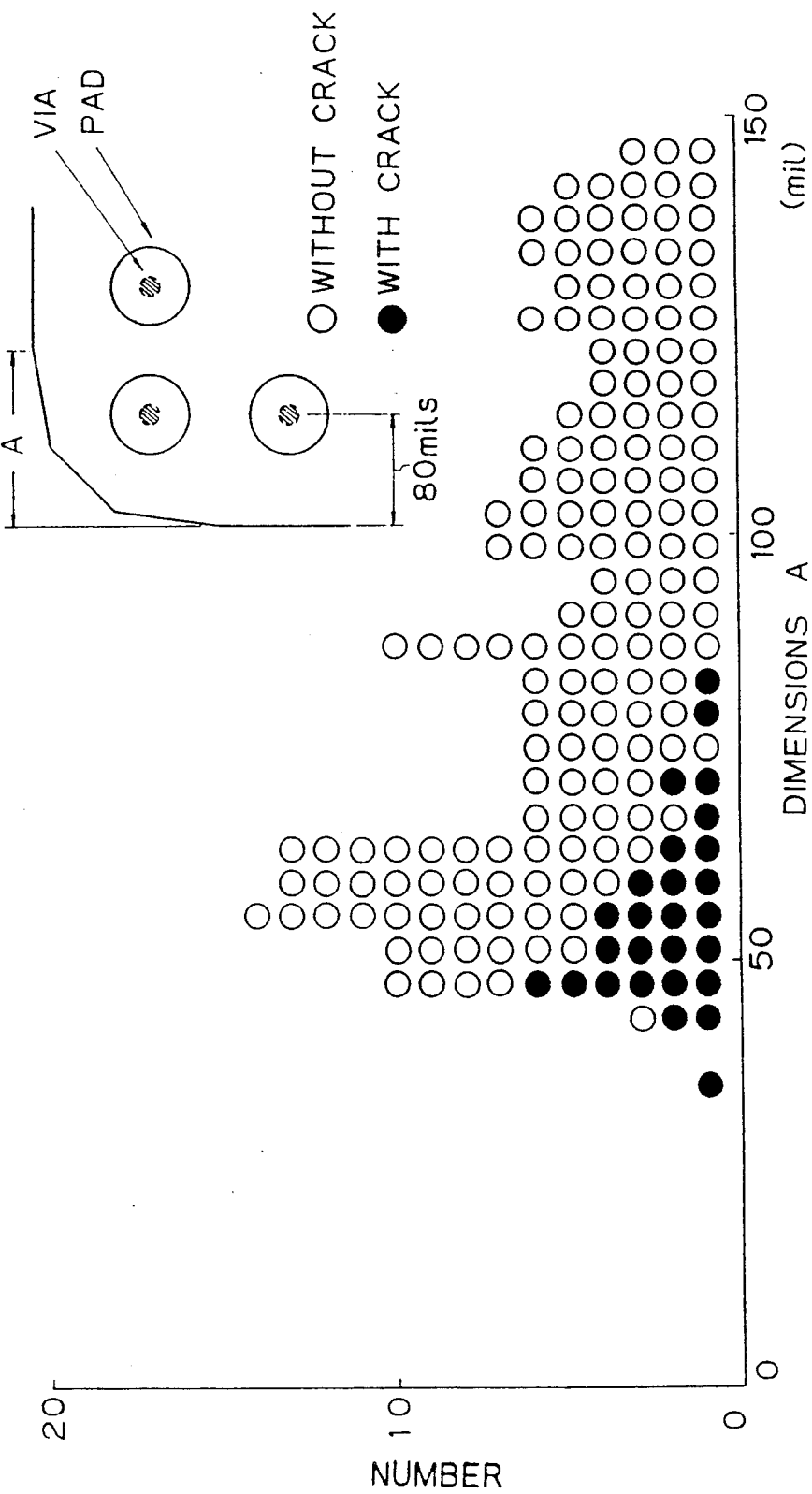

DIMENSION A : SMOOTH EDGE 80 ~ 200 mils
DIMENSION B : LOCATION OF VIA HOLE 80 mils
DIAMETER C : DIAMETER OF VIA HOLE 20 mils
ANGLE $\theta_1$ : ANGLE OF SMOOTH CHAMFER 2±1°

CERAMIC BASE FOR A SEMICONDUCTOR DEVICE

BACKGROUND OF THE INVENTION

1. Field of the Invention

This invention relates to a ceramic base for a semiconductor device, and more particularly, to such a ceramic base in which the generation of cracks can be prevented.

2. Description of the Related Art

A ceramic base used for mounting thereon a semiconductor chip or a similar electronic element is made of ceramic.

As is well known in the prior art, ceramic generally has a high compression stress resistance, and a low tension resistance.

In a process for manufacturing semiconductor devices, a plurality of such ceramic bases are stored in a storage or accommodation station, and picked up therefrom one by one and fed to the various work stations, such as a semiconductor chip mount station. In the accommodation station, the ceramic bases are guided by a suitable guide means, such as a rail, and fed in the forward direction. To smoothly feed these ceramic bases along the rail, it is usually necessary to provide gaps between side edges of the ceramic bases and side walls of the rail, and due to such gaps, the ceramic bases might slew transversely while being fed along the rail and come into touch with an adjacent ceramic base. This sometimes causes the generation of cracks or flaws in the ceramic base, particularly at corners or edge portions of the ceramic base. Also, a part of the ceramic base is sometimes broken, i.e., edges of the ceramic base are sometimes nicked.

To prevent the generation of such cracks or flaws, as shown in FIG. 12, it is well known in the prior art for a rectangular ceramic base to be provided with bevel portions B at the respective corners of the ceramic base, to avoid a possible concentration of stress when an external force is exerted on the ceramic base.

In general, these bevel portions B effectively prevent the ceramic base form being broken at the corner portions, but do not completely avoid the generation of cracks or flaws in the ceramic base.

SUMMARY OF THE INVENTION

An object of the present invention is to provide a ceramic base used for mounting an electric element thereon, such as a semiconductor chip or the like, in which new bevel portions are formed to effectively prevent a generation of cracks or flaws in the ceramic base.

According to the inventor's observations during experiments involving many samples, a crack is not generated first at a corner which is formed by the bevel, but at a point inside of the ceramic base, and inward from the corner, as shown in FIG. 12. In particular, a laminated-type ceramic base generally has a via or through hole 10 which is filled with a conductive material for mutually connecting electrical patterns formed on the upper and lower surfaces of the ceramic package. In many samples of ceramic bases the following has been observed; i.e., a crack extends toward the via, which generally has a low strength, from a point along the edge of the base near to the via, as shown in FIG. 9. If such a large-sized crack is generated, a serious problem, for example, a disconnection of the electrical patterns in the vicinity of the via, arises.

To solve the above problems, there is provided a plate-shaped base used for mounting an electric element thereon, such as a semiconductor chip, which is made of a material consisting essentially of ceramic, the base having, in a plan view, at least one corner portion located between two adjacent side walls, characterized in that the corner portion comprises a main bevel and at least two auxiliary bevels located at the respective sides of the main bevel and extending to the two side walls, respectively, so that two first corners are defined between the main bevel and the auxiliary bevels, respectively, and two second corners are defined between the auxiliary bevels and the side walls of the base, respectively.

In the present invention, since a corner portion of the ceramic base is provided with a main bevel and two auxiliary bevels, if the ceramic base is moved suddenly, it first collides with a corner between the auxiliary bevel and the side wall of the base. Then after one bounce, the ceramic base collides with the opposite corner between the auxiliary bevel and the side wall. Thus, a distance between a position of the first collision to a position of the second collision is significantly reduced, as compared with that of a ceramic package known in the prior art.

Consequently, according to the present invention, both of the positions of the first and second collisions are located on the side wall inward of the corner portions of the ceramic base. Therefore, a rotational moment exerted on the ceramic package due to a reaction force of the first collision becomes smaller, and as a result, a rotational energy of the ceramic base is reduced and, therefore, a tension force exerted on the base at a second collision becomes significantly smaller, and thus the generation of cracks caused by the second collision is prevented.

BRIEF DESCRIPTION OF THE DRAWINGS

FIG. 8 shows experimental results for samples of ceramic bases of a prior art example;

FIG. 9 shows experimental results for samples of ceramic bases of an embodiment of this invention;

As understood from TABLE I and FIGS. 8 and 9, according to the embodiment of this invention, the crack generation rate was significantly reduced, compared with the prior art and the comparative example.

DESCRIPTION OF THE PREFERRED EMBODIMENTS

Figure 1:
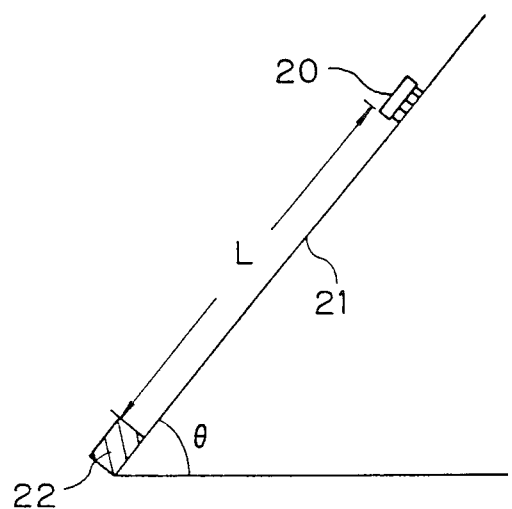
FIG. 1 is an view illustrating an experiment in which a exemplarity ceramic base slides down along a slope.
Figure 2:
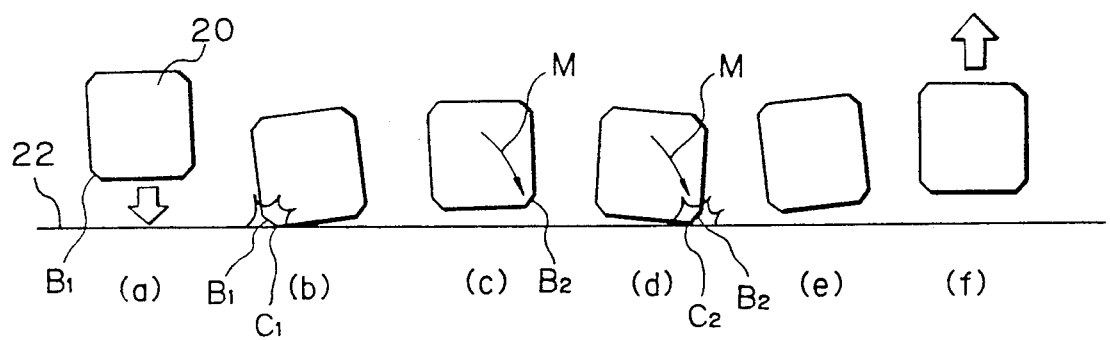
FIG. 2 shows a series of motions of the ceramic base after collision with a stopper and a bounce up at a corner thereof.

First, a mechanism of the generation of cracks will be described with reference to FIGS. 1 and 2. The inventors made a study of such a crack generating mechanism, and conducted experiments using an apparatus as shown in FIG. 1.

In this experiment, samples of the ceramic base 20 were allowed to slide down an inclined rail 21, and the states of the sliding samples were visually recorded by a high speed video recorder so that the mechanism of the generation of cracks could be analyzed. As a result, it has been noted that, as shown in FIG. 2, the ceramic base 20 is usually inclined very slightly with respect to a stopper surface 22 while sliding down. Thus, the ceramic base 20 collides with the stopper surface 22 by a corner $C_1$ defined by a bevel $B_1$, as shown in (b) of FIG. 2. After one bounce, as shown in (c), the ceramic base 20 again collides at an opposite corner $C_2$, as shown in (d), defined by a bevel $B_2$. As a result of this experiment, it was noted that the generation of cracks was not caused by the first collision, but by the second collision, apparently for the following reasons.

At the time of the first collision, the ceramic base 20 maintains the same profile as it slides down the rail 21 and, therefore, only a compression force is exerted on the ceramic base 20. Such a mere compression force does not cause the generation of cracks. At the time of the second collision, however, the ceramic package 20 is subjected to a large rotational moment in a direction indicated by an arrow M about the position at the moment of first collision, i.e., the corner $C_1$, due to a reaction force of the first collision, and therefore, the ceramic base 20 again collides with the stopper surface 22 at the opposite corner $C_2$, with a relatively large rotational energy. This second collision is as if a long, thin rod is held at one end thereof while the other end thereof collides with an object at a relatively small angle. Thus, the ceramic base 20 is subjected to a large tension force at the colliding surface thereof and, therefore, cracks are generated by the second collision.

The inventors have created the present invention on the basis of the above-mentioned knowledge obtained from their experiments.

Figure 3:
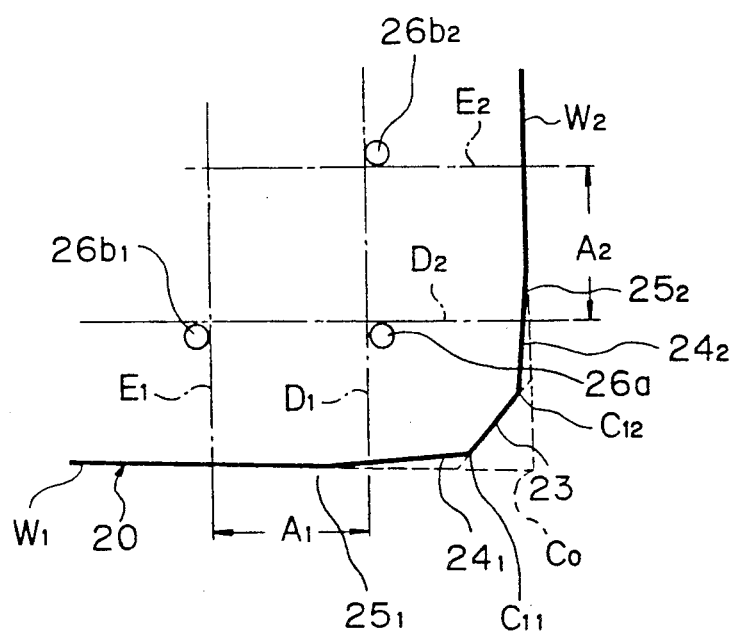
FIG. 3 is a partial plan view of a ceramic base having second or auxiliary bevels as well as the main bevels according to the present invention.

FIG. 3 is a partial plan view of a ceramic base according to the present invention. The rectangular and plate-shaped ceramic base 20 made of a material consisting essentially of ceramic and is provided at each corner portion $C_0$ thereof with a main bevel 23, which is the same as that of the prior art, and auxiliary bevels $24_1$ and $24_2$ positioned at the respective sides of the main bevel 23. Each auxiliary bevel $24_1$, $24_2$ may be either a flat surface or a convex or rounded surface. Note, the surface of the main bevel 23 is not limited, and may be flat, round (R) or convex.

New corners $25_1$ and $25_2$ defined between these two auxiliary bevels $24_1$ and $24_2$ and the side walls $W_1$ and $W_2$ of this ceramic base 20, respectively, are positioned in areas $A_1$ and $A_2$ defined between vias $26b_1$ and $26b_2$ (lines $D_1$ and $D_2$) located nearest to the corner $C_0$ and an adjacent via $26a$ (lines $E_1$ and $E_2$) parallel to the walls $W_2$ and $W_1$, respectively. Note, advantageously each corner $25_1$ or $25_2$ is located as far away as possible from the vias, i.e., is located at a position on the side wall $W_1$, $W_2$ and between two vias ($26a$; $26b_1$, $26b_2$) in the vicinity of a corner $C_0$ of the ceramic package 20.

Here, "via" means any through hole, blind hole, cavity or the like at which stress is easily concentrated when the ceramic base 20 is subjected to an external force, such as a compression or tension force.

Although FIG. 3 illustrates only a part of the rectangular ceramic base 20, i.e., a portion of corner $C_0$, each of the other three corners is also provided with two auxiliary bevels as well as one main bevel, in the same manner as mentioned above.

Figure 4:
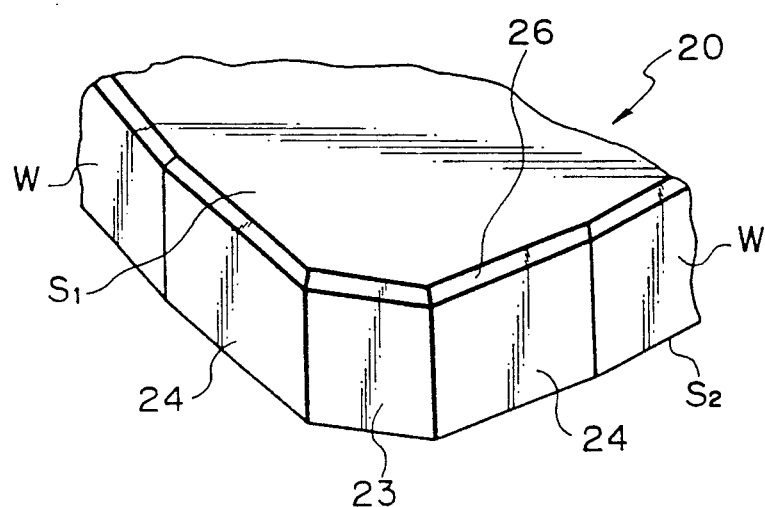
FIG. 4 is a partial perspective view of a ceramic base having additional bevels according to the present invention.

In an embodiment shown in FIG. 4, in addition to the main bevel 23 and auxiliary bevels 24, sub bevels 26 may be formed between the front and rear surfaces $S_1$ and $S_2$ and the main bevel 23 and auxiliary bevels 24, respectively.

Figure 5:
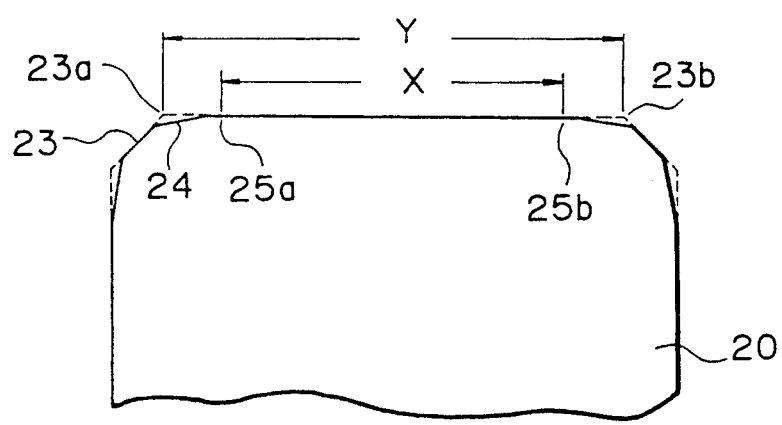
FIG. 5 is a plan view illustrating the distances between the corners defined by these bevels.

According to this invention, as the ceramic base 20 is provided at each corner $C_0$ thereof with a main bevel 23 and two auxiliary bevels 24, if the ceramic base 20 slides down, it first collides with a stopper surface at a corner $25a$ in FIG. 5. After one bounce, the ceramic base 20 again collides with the stopper surface at the opposite corner $25b$. As clearly understood from FIG. 5, a distance X from a position of the first collision, i.e., a corner $25a$, to a position of the second collision, i.e., a corner $25b$, is significantly reduced, compared with a distance Y from a corner $23a$ to a corner $23b$ which corresponds to a distance between the first and second positions of a collision in a ceramic base known in the prior art.

Consequently, according to the present invention, both of the positions of the first and second collisions $25a$ and $25b$ are located on the side wall at positions inward of the corner $C_0$ of the ceramic base 20. Therefore, a rotational moment exerted on the ceramic base 20 due to a reaction force of the first collision becomes smaller than that of the prior art. As a result, a rotational energy of the ceramic base 20 is reduced and, therefore, a tension force exerted on the package 20 at a second collision becomes significantly smaller, and thus the generation of cracks upon the second collision is prevented.

Also, according to the above-mentioned embodiment, since the corners $25_1$ and $25_2$ in FIG. 3, i.e., the positions of collision, are located far from the vias, the exertion of a very large stress on the vias is prevented and, therefore, the generation of cracks at these vias is prevented or reduced. It should be appreciated that, although the areas around the vias are generally weak, such weak points can be compensated.

Figure 6:
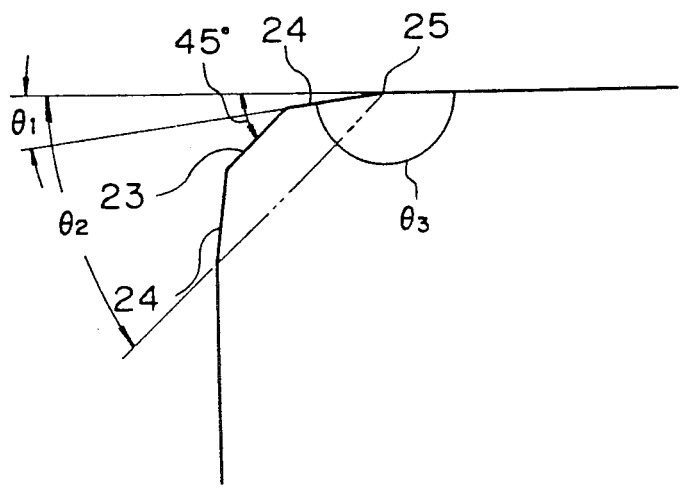
FIG. 6 is a partial plan view illustrating the dimensions of the corner provided with bevels.

Assuming that a single larger bevel was formed, as shown by a two-dot line in FIG. 6, to shift inside the positions of collision, i.e., corners 25, without an auxiliary bevel, an angle $\theta_2$ (45°) at the corners 25 would become much larger than the angle $\theta_1$ at the corners 25 of the preferred embodiment. Accordingly, stress would still be concentrated at the corners 25 of the angle $\theta_2$, and such a solution would not completely prevent the generation of cracks.

Figures 7A, 7B, 7C:
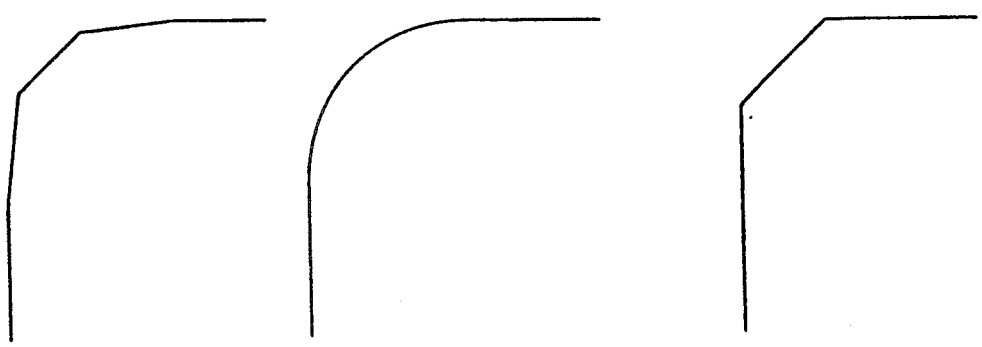
FIGS. 7A, 7B and 7C are partial plan views illustrating the respective bevels, in which 7A shows bevels of an embodiment; 7B, a round-shaped bevel; and 7C, a bevel of the prior art.

Assuming also that a relatively large round or R-shaped bevel was formed, as shown in FIG. 7B, so that a tangent line of the R-shaped bevel was smoothly continued to the side walls of the ceramic base 20 to shift inside the tangent point, without auxiliary bevels, such a solution would not completely prevent the generation of cracks, since a position of the first collision is not definitely determined under the conditions of sliding down. Sometimes, a position of first collision may be on the R-shape portion, so that a distance between the positions of first and second collisions would become longer, and thus a relatively large stress might be exerted on the ceramic base 20.

The following table I shows experimental results, i.e., rate of crack generation number of samples with cracks, for samples of ceramic bases of an embodiment of this invention, a comparative example having a large R-shape bevel, and a prior art example, as shown in FIGS. 7A, 7B, and 7C, respectively.

TABLE I

| Samples/Conditions | A | B |
|---|---|---|
| Embodiment | 0/20 | 10/20 |
| Comparative example | 2/20 | 19/20 |
| Prior art example | 20/20 | 20/20 |

The samples of ceramic base 20 in FIG. 1 were dropped and slid down along the slope of a rail 21 and, then, hit on a steel block 22. The distance L of the slope along which the base traveled was 30 cm in condition A and 60 cm in condition B. The angle $\theta$ of the slope was 60°. The samples were all ceramic bases used for a pin-grid array type semiconductor device. The rail 21 was made of acrylic and the steel block was made of tungsten carbide.

FIG. 8 shows experimental results for the samples of ceramic bases of a prior art example. On the other hand, FIG. 9 shows experimental results for the samples of ceramic bases of an embodiment of this invention.

As understood from TABLE I and FIGS. 8 and 9, according to the embodiment of this invention, the crack generation rate was significantly reduced, compared with the prior art and the comparative example.

In the embodiment of a ceramic base as mentioned above, the angle of the main bevel 23 with respect to the side wall of the ceramic base 20 is approximately 45°. On the other hand, the angle ($\theta_1$ in FIG. 6) of the auxiliary bevels 24 with respect to the side walls of the ceramic base 20 can be determined as follows.

In an accommodation or storage station, the ceramic bases 20 can be fed or slid downward in tandem along a guide means such as a rail having side walls which define small gaps with respect to the side edges of the ceramic base 20. Due to these gaps, the ceramic base swings transversely while sliding downward along the rail.

Figure 10:
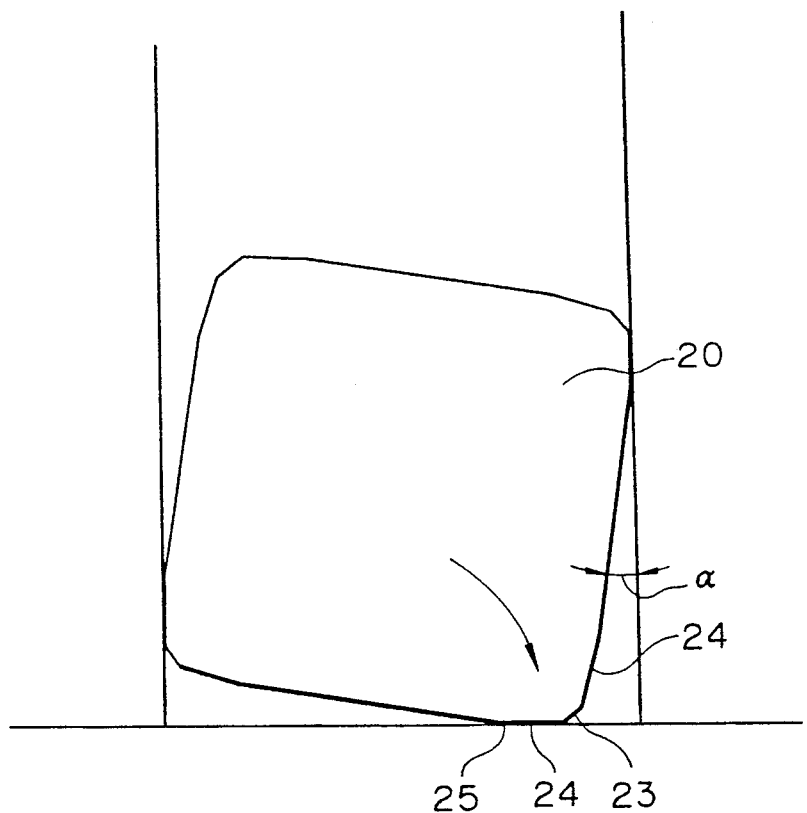
FIG. 10 is a view illustrating an exemplary ceramic base which slews and is subject to a secondary collision.
Figure 12:
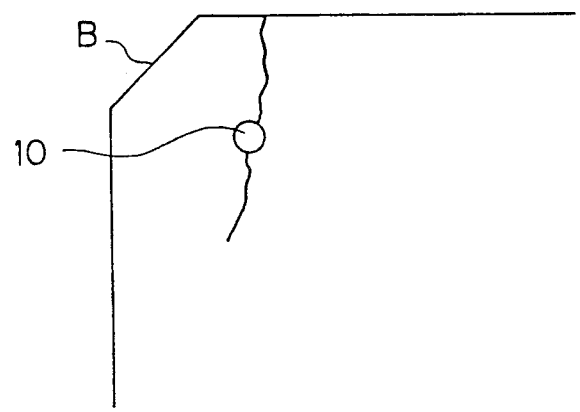
FIG. 12 is a partial plan view of a ceramic base having a bevel known in the prior art.

Here, assuming that a maximum swing angle is $\alpha$ in FIG. 10, the angle $\theta_1$ in FIG. 6 of the auxiliary bevels 24 with respect to the side walls should not be smaller than $\alpha$, i.e., $\theta_1 \geq \alpha$.

In this case, as shown in FIG. 10, after the ceramic base 20 first collides with the stopper surface and then bounces away therefrom, it collides again with the stopper surface at the other corner. Under the above conditions the force of such a second collision is taken by the corner 25 of the auxiliary bevel 24, or at least by the entire face of the auxiliary bevel 24.

Assuming that such a second collision occurred at the corner 23a (FIG. 5), the crack generation rate would be increased, since the angle (approximately 45°) of the corner 23a is narrower than that of the corner 25. Therefore, according to the present invention, such a severe collision by the corner 23a (FIG. 5) can be avoided.

For example, if a maximum swing angle ($\alpha$) of the ceramic package in the accmmodation station is 2°, the complementary angle $\theta_3$ in FIG. 6 at the corner 25 is preferably 178° or slightly smaller. In addition, a subsequent ceramic base might be swung in the opposite direction with respect to a preceding ceramic base. Therefore, advantageously, from the viewpoint of safety, the complementary angle $\theta_3$ in FIG. 6 at the corner 25 is 176° or slightly smaller.

Figure 11:
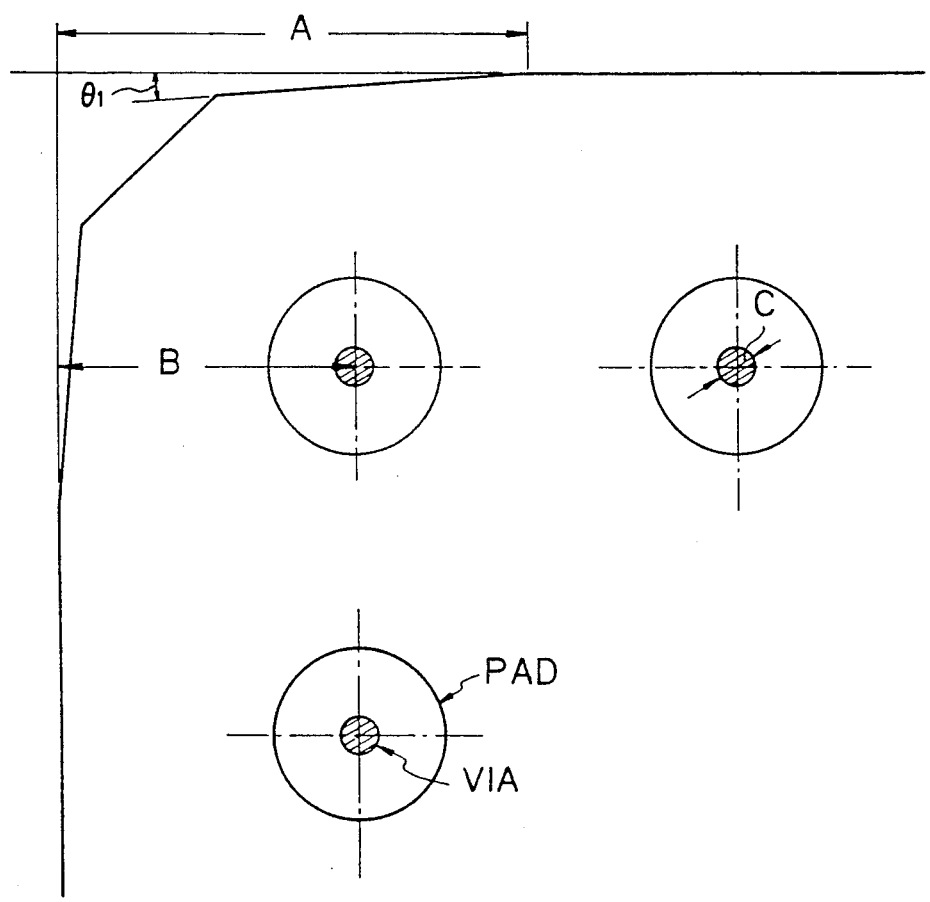
FIG. 11 shows dimensions of a typical embodiment of a ceramic base according to the present invention.

FIG. 11 and the following TABLE II show dimensions of a typical embodiment of a ceramic base according to the present invention.

TABLE II

| | Control Data | Measurement Data | | |
|---|---|---|---|---|
| | | max | min | ave |
| Dimension A (Smooth chamfer) | 80~200 (mil) | 173 (mil) | 114 (mil) | 144 (mil) |
| Angle of $\theta_1$ | 2 ± 1° | 2.5° | 1.2° | 1.7° |

It should be understood by those skilled in the art that the foregoing description relates to only a preferred embodiment of the disclosed invention, and that various changes and modifications may be made in the invention without departing from the spirit and scope thereof. For example, this invention can be applied to various types of packages having a ceramic base used for mounting a semiconductor chip, such as a pin-grid array type package, chip-carrier type package, or the like.

I claim:

1. A ceramic base used for mounting thereon a semiconductor chip, an electronic element or the like, said base being plate shaped and made of a material consisting essentially of ceramic, and said base having, in a plan view, at least one corner portion located between two adjacent side walls, wherein said corner portion comprises:
   a main bevel, and
   at least two auxiliary bevels located at respective sides of said main bevel and extending to said two side walls, respectively, so that two first corners are defined between said main bevel and said auxiliary bevels, respectively, and two second corners are defined between said auxiliary bevels and said side walls of the base, respectively.

2. A ceramic base as claimed in claim 1, wherein said two adjacent side walls form an angle of approximately 90° therebetween, and said side walls and said main bevel (23) form an angle of approximately 135° therebetween, respectively, so that each of said first and second corners has an angle of more than 135°.

3. A ceramic base as claimed in claim 1, further comprising a first via located nearest to said corner portion and at least one second via adjacent to said first via, wherein said second corners are positioned in areas which pass through said first and second vias respectively, and are in parallel to said respective side walls.

4. A ceramic base as claimed in claim 3, wherein two second vias are provided, one second via being positioned on a first straight line passing through said first via and in parallel to one of said side walls, and the other second via being positioned on a second straight line passing through said first via and in parallel to the other side wall.

5. A ceramic base as claimed in claim 4, wherein one of said second corners is positioned in an area defined between said second straight line and a line passing through said one of said second vias and the other second corner is positioned in an area defined between said first straight line and a line passing through said other second via and in parallel to the first side wall ($W_1$).

6. A ceramic base as claimed in claim 1, wherein a complementary angle of each of said second corners defined between said respective auxiliary bevel and said respective side wall of the base is equal to or a little more than a maximum swing angle, provided that the swing angle is determined as follows: Said ceramic base swings transversely while being fed along guide means at said swing angle, assuming that a plurality of said ceramic bases are fed or slide downward in tandem along said guide means which define small gaps with respect to the side walls of the ceramic base.

7. A ceramic base as claimed in claim 1, wherein said base has a front surface and a rear surface and sub bevels are formed between said front surface and said main bevel and said auxiliary bevels respectively, and between said rear surface and said main bevel and said auxiliary bevels respectively.

8. A ceramic base as claimed in claim 1, wherein each of said auxiliary bevels is a flat surface.

9. A ceramic base as claimed in claim 1, wherein each of said auxiliary bevels is a convex, rounded surface.

* * * * *